United States Patent [19]
Ohno

[11] Patent Number: 5,654,632
[45] Date of Patent: Aug. 5, 1997

[54] METHOD FOR INSPECTING SEMICONDUCTOR DEVICES ON A WAFER

[75] Inventor: Yasukazu Ohno, Kasugai, Japan

[73] Assignees: Fujitsu Limited, Kawasaki; Fujitsu VLSI Limited, Kasugai, both of Japan

[21] Appl. No.: 689,006

[22] Filed: Jul. 30, 1996

Related U.S. Application Data

[63] Continuation of Ser. No. 319,046, Oct. 6, 1994.

[30] Foreign Application Priority Data

Dec. 21, 1993 [JP] Japan ................................ 5-322815

[51] Int. Cl.$^6$ ........................................ G01R 31/28
[52] U.S. Cl. ...................... 324/158.1; 324/73.1; 324/765
[58] Field of Search ............................ 324/158.1, 73.1, 324/765, 768, 763, 719; 437/8; 257/40, 48; 371/15.1; 364/552, 550, 551.01

[56] References Cited

U.S. PATENT DOCUMENTS

| | | | |
|---|---|---|---|
| 4,875,002 | 10/1989 | Sakamoto et al. | 324/765 |
| 4,985,676 | 1/1991 | Karasawa | 324/754 |
| 5,286,656 | 2/1994 | Keown et al. | 324/768 |

*Primary Examiner*—Vinh P. Nguyen
*Attorney, Agent, or Firm*—Nikaido, Marmelstein, Murray & Oram LLP

[57] ABSTRACT

A method is disclosed, which sequentially inspects a plurality of semiconductor devices formed on a semiconductor wafer. This method executes a full inspection analysis on the individual devices on the wafer. The full inspection is carried out based on predetermined inspection criteria to determine whether or not the inspected devices are defective or properly functional. The number of devices determined as good ones during the full inspection analysis is sequentially counted, whereas the counted number is reset to zero whenever any device is determined to be defective during the full inspection routine. A simplified inspection analysis is executed on a predetermined number of devices when the counted number reaches a predetermined value. The simplified inspection is carried out against some of all the predetermined inspection criteria to determine whether or not the inspected devices are defects.

3 Claims, 5 Drawing Sheets

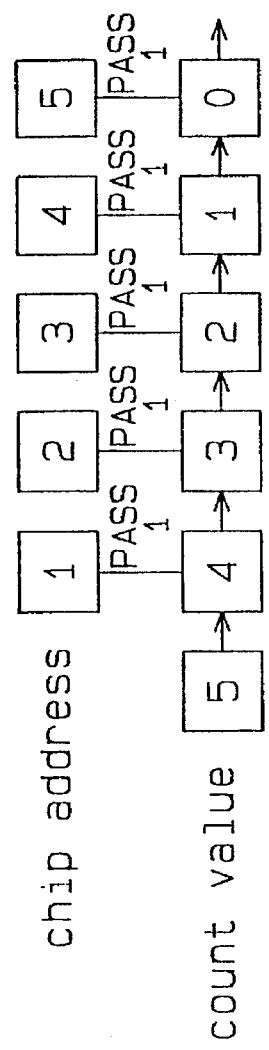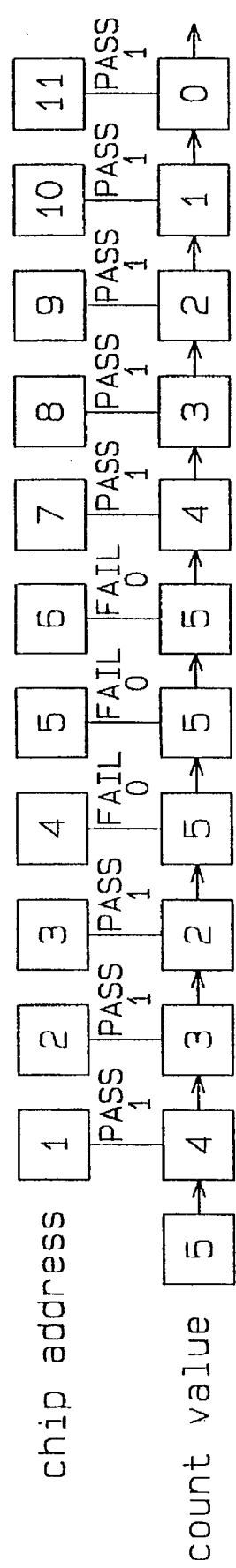

METHOD FOR INSPECTING SEMICONDUCTOR DEVICES ON A WAFER

This application is a continuation of application Ser. No. 08/319,046 filed Oct. 6, 1994.

BACKGROUND OF THE INVENTION

1. Field of the Invention

The present invention relates generally to a method and apparatus for inspecting a semiconductor wafer having a plurality of semiconductor devices such as Large Scale Integrated circuits (LSI). More particularly, this invention relates to an inspection method and inspection apparatus which performs a plurality of inspections on semiconductor devices with measuring probes contacting the semiconductor devices in order to determine whether or not the semiconductor devices on the wafer are defective.

2. Description of the Related Art

Typically, semiconductor devices formed on wafer materials undergo inspection before being assembled with other devices to form finished products. Ideally, only those semiconductor devices which have been detected as having been good are used in later assembly processes. This improves the yield economics of the semiconductor devices at the time they are packaged and shipped from the factory. Inspecting semiconductors in this fashion is usually done using measuring probes that come in contact with the semiconductor devices. During the inspection's execution a number of criteria are used to test the various semiconductor devices. These criteria, or inspection items comprise a check list against which the semiconductor devices are tested. For example, there are several hundreds to several thousands semiconductor devices on a single wafer, and about 20 to 30 inspection items used during the inspection of each semiconductor device. Consequently, the wafer inspection takes a considerable amount of time. Various methods have been proposed to shorten the wafer inspection time while keeping the yield of the semiconductor devices as high as possible. Such methods include a way of selectively inspecting some of the entire semiconductor devices (selective inspection) and thereby reducing the number of criteria or inspection items used in testing the semiconductor devices.

For example, Japanese Unexamined Patent Publication No. 61-216439 discloses a first wafer inspection method which selectively uses both a full and selective inspection process depending on the particular wafer region being inspected. This method is used due to the fact that different areas of the wafer typically have varying numbers of defects. According to this method, a full inspection is applied to the wafer's peripheral portion which has a statistically high probability of defect occurrence. A selective inspection is performed on the wafer's center which typically has a low probability of defect occurrence.

Japanese Unexamined Patent Publication No. 4-65143 discloses a second wafer inspection method in which the number of inspection criteria or items used during the inspection changes depending on the particular wafer region being inspected. This method, like that disclosed in the 61-216439 publication, utilizes the fact that various wafer regions have differing probabilities of containing defects. This particular inspection method executes a full inspection in the wafer's peripheral portion where a statistically high probability exists for the occurrence of defects, with respect to all of inspection criteria. In the wafer's center region, where the probability of occurrence of defects is relatively low, this inspection method first inspects a predetermined number of semiconductor devices using all of the inspection criteria. When all the inspected semiconductor devices are determined as adequate, subsequent semiconductor devices are inspected with a limited number of the preselected inspection criteria. If any defective semiconductor device is found in this partial inspection, then all subsequent semiconductor devices are inspected using all of the preselected inspection criteria.

Both of the above described first and second inspection methods unfortunately assume that the probability of defect occurrence is higher in the wafer's peripheral portion than it is in the wafer's center portion. In fact, the location of defects on a wafer depends on the fabrication process used to produce the semiconductor. In some cases regions other than the wafer's peripheral portion have the highest probability of containing defects. Typically, defect occurrence is concentrated in specific wafer areas such as the wafer's peripheral or center portion. None the less, defects can occur on any portion of the wafer due to minute foreign matters or inadequate washing. It is often times therefore difficult to specify the probable locations of defects.

When the occurrence of defects is concentrated in the wafer's center portion, some defects may go undetected by the first and second inspection methods. Specifically, when the first inspection method executes a selective inspection in the wafer's center portion, it may not detect certain defects that may in fact exist in the center region. Moreover, according to the second inspection method, when all of a predetermined number of semiconductor devices inspected first have passed the inspection, subsequent semiconductor devices are inspected using only some of the predetermined inspection criteria. Should defects exist of a type not detectable by the predetermined inspection criteria, those defects end up being determined as non-defects, or in other words, as good devices. In addition, if defects do exist among the predetermined number of semiconductor devices inspected first, the second inspection method executes an inspection routine using all of the inspection criteria thereafter. This inhibits the possibility of shortening the wafer inspection time.

Due to the above mentioned difficulties in specifying the probable locations of defects in semiconductor wafers, the first and second inspection methods are subject to overlooking existing defects. Consequently both methods have a tendency to reduce the yield of packaged semiconductor devices at the time of their factory shipment.

SUMMARY OF THE INVENTION

Accordingly, it is a primary objective of the present invention to provide an inspection method for a semiconductor wafer, which can detect defective semiconductor devices occurring anywhere on a wafer with an improved accuracy, and an inspection apparatus which executes this inspection method.

It is another objective of this invention to provide an inspection method and inspection apparatus which can shorten the inspection time for a wafer.

To achieve the foregoing and other objects and in accordance with the purpose of the present invention, an improved inspection method for a semiconductor wafer is provided. This method executes full inspection on individual devices formed on a semiconductor wafer. The full inspection routine is performed using an entire spectrum of inspection criteria in order to determine whether or not the inspected semiconductor devices are defective. The number of devices determined as good during the full inspection are sequentially counted in such a way that the counted number is reset to zero whenever any device is determined to be defective. A simplified inspection is executed on a predetermined number of devices when the counted number reaches a predetermined value. This simplified inspection is carried out against a select portion of all the predetermined inspection criteria in order to determine whether or not the inspected devices are defective.

According to the method of the present invention, when a predetermined number of semiconductor devices are successively determined as properly functioning (i.e., having passed the inspection), the simplified inspection routine is then performed. Should a predetermined number of semiconductor devices be detected as functional during the full inspection, the implication arises that the number of defects in the semiconductor wafer region just inspected is low. Based on the implication, the simplified inspection is performed in the region where the occurrence of defects is low. Even if defective semiconductor devices are present on any location on the wafer, the probability of the detection of the defects can thus be improved. The combination of the simplified inspection and the full inspection routines according to this invention can also shorten the time of inspecting a semiconductor wafer.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

FIGS. 1 through 6 illustrate a first embodiment of the present invention:

FIG. 1 is a flowchart illustrating the operation of a wafer inspection apparatus according to the first embodiment of this invention;

FIG. 2 depicts a block diagram of the wafer inspection apparatus;

FIG. 3 is an exemplary plan view of a wafer;

FIGS. 4A and 4B are diagrams showing count values when the normal probing test is conducted;

FIG. 5 is an exemplary plan view showing chip addresses; and

FIG. 6 is a diagram showing count values when the simple probing test is conducted.

DETAILED DESCRIPTION OF THE PREFERRED EMBODIMENTS

A method and apparatus for inspecting a semiconductor wafer according to a first embodiment of the present invention will now be described referring to the accompanying drawings. In this embodiment, the present invention is applied to a wafer inspection apparatus as shown in FIG. 2.

In this embodiment, each group of similar components or lot on the LSI circuit contains about 30 semiconductor wafers as substrates. Semiconductor devices (hereinafter called chips) formed on the about 30 wafers are produced through the same fabrication process. The wafers, each of which contain about 1000 chips, undergo the same fabrication process. Therefore, the individual wafers tend to exhibit a correlation among those wafer areas having concentrated chip defects and those areas having a particular probability of defect occurrence.

Figure 2:
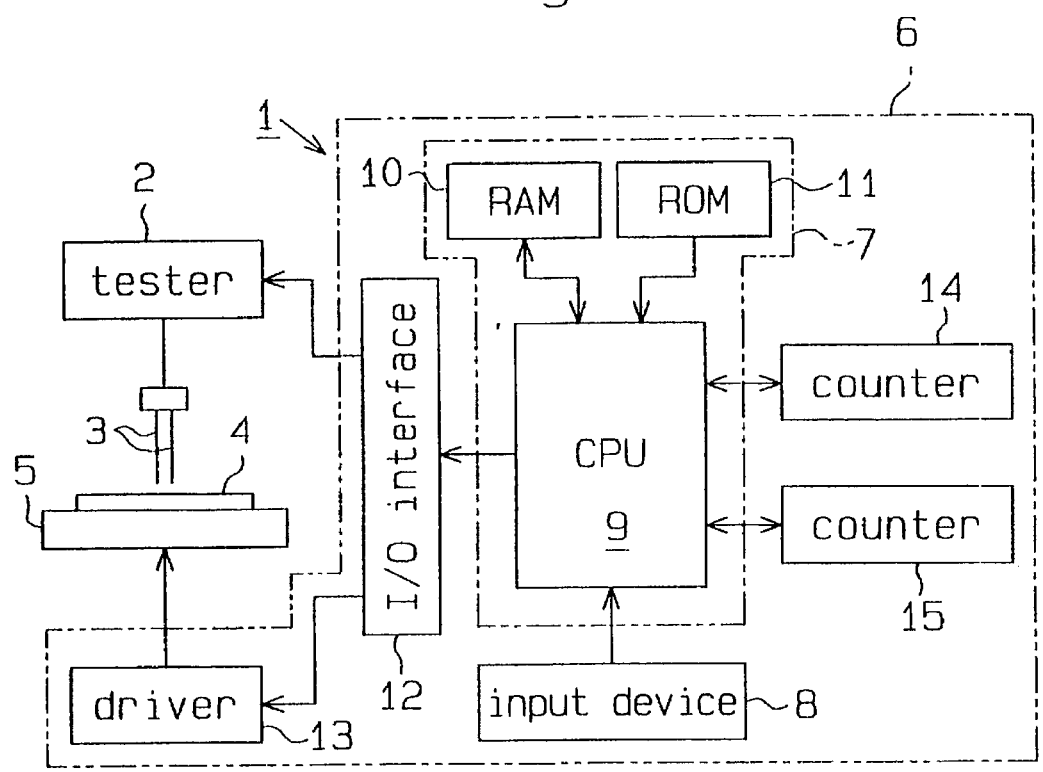

As shown in FIG. 2, a wafer inspection apparatus 1 includes a plurality of measuring probes 3, a platform 5 for moving a wafer and a controller 6. The measuring probes 3 are connected to a semiconductor testing apparatus 2. The platform 5 is driven and controlled by the controller 6. The platform 5, when driven with a loaded wafer 4, moves to a chip inspection position in alignment with the probes 3 for probe to chip contact. The controller 6 includes a microcomputer 7, an input device 8, an input/output (I/O) interface 12, a driver 13 and counters 14 and 15.

The microcomputer 7 has a central processing unit (CPU) 9, a RAM-based work memory 10 and a ROM-based program memory 11. The CPU 9 is connected via the I/O interface 12 to the tester 2. The CPU 9 is further connected via the I/O interface 12 and the driver 13 to the wafer moving platform 5. The CPU 9 is also connected to the input device 8 and the counters 14 and 15.

The CPU 9 operates according to control programs stored in the program memory (ROM) 11, and the results of an operation performed by the CPU 9 are temporarily stored in the work memory 10. The work memory 10 serves to temporarily store data input through the input device 8.

Figure 3:
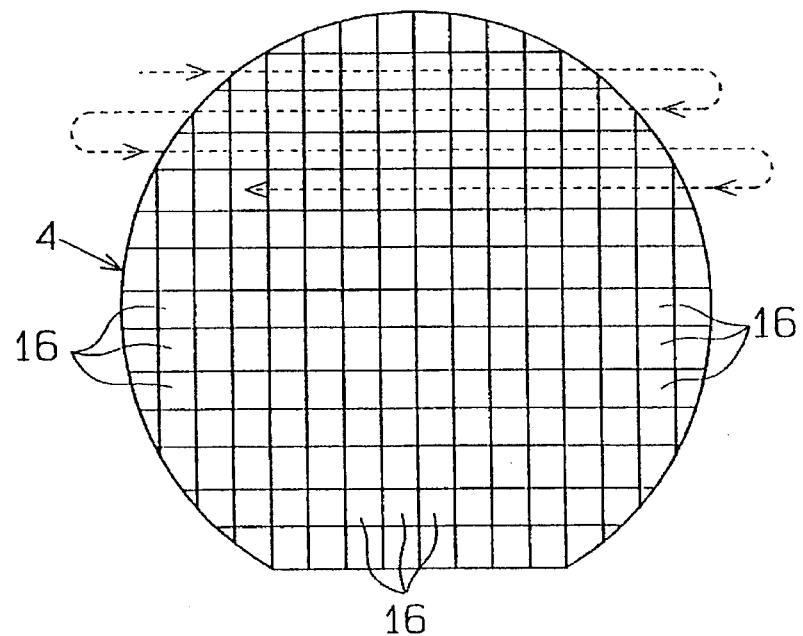
Figure 5:
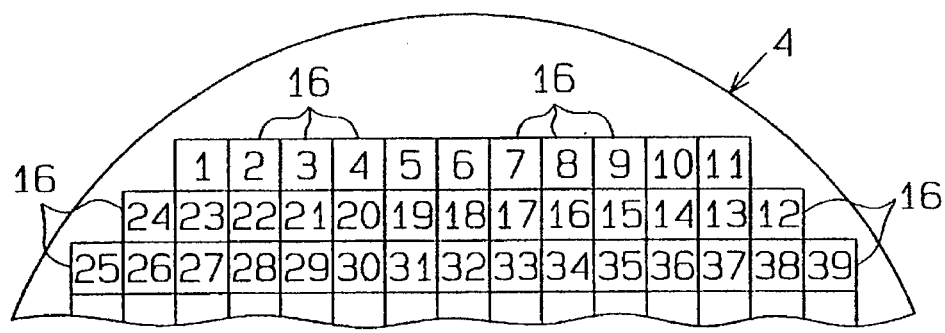

The work memory 10 stores the locations of the individual chips 16 on the wafer 4 as addresses matching with the inspection order, as shown in FIG. 5. Each chip 16 is inspected according to the address assigned to the chip 16. More specifically, the chips (LSI) 16 formed on the wafer 4 are sequentially inspected in the inspection order indicated by a broken arrow line as shown in FIG. 3. At the time of inspection, the measuring probes 3 contact each chip and provide diagnostic data in accordance with each inspection criteria. The values measured during this diagnostic routine are then provided to the CPU from the tester 2.

The work memory 10 stores preset specification data corresponding to the 30 or so inspection criteria. These inspection criteria are classified into one of three types of chip test routines: a contact test, a characteristic test or a function test. The contact test checks, for example, if there is conduction between predetermined terminals of each chip. The characteristic test uses a current applied between predetermined chip terminals to check the chip's electric characteristics. The function test examines the output response of the chip 16 to an input signal in order to further diagnose the functionality of the chip 16. The CPU 9 compares the data containing the measured values from the tester 2 with the data of the specification values stored in the work memory 10 to determine if the chip 16 is defective. In this way, a test is performed for each inspection criteria. A decisional flag in the work memory 10 is set to "0" when the chip 16 is determined as defective by the CPU 9 and set to "1" when the chip 16 is determined as properly functioning.

The wafer inspection apparatus 1 performs full inspections or normal probing tests on all of chips 16 deposited on the first wafer in the same lot. In the normal probing test, wafer inspection is carried out according to a predetermined number of criteria. According to the present embodiment, the number of criteria is, but need not be limited to approximately 30 items. The work memory 10 stores test data resulting from the normal probing test. The test data consists of the address of any chip 16 that is determined defective, the particular inspection criteria used in testing whether the chip 16 is defective and the number of defects identified using each inspection criteria. Based on this test data, the CPU 9 determines the contents of the inspection to be executed by the wafer inspection apparatus on the second and subsequent wafers 4. The contents of the inspection are those of either the normal probing test or the simple probing test. In the simple probing test or simplified inspection, certain of the approximately 30 inspection criteria used in the normal probing test are omitted.

The specific criteria used in the simplified inspection are a subset of that used during the full inspection routine. More specifically, based on a statistical analysis of test data taken during the initial inspection of wafer 4, those criteria which are determined to lead to findings of considerably low probabilities of defect detection are omitted from the criteria used in the full inspection. The reduced set of criteria are used in the simplified test. In this embodiment, there are approximately 10 to 15 simplified inspection criteria, although the present invention may also be practiced using other numbers of criteria. According to this embodiment, should a defective chip 16 be found during the normal or simple probing test, the current inspection routine is stopped and the operation enters a "fail stop mode" to inspect the next chip 16. The above described full and simplified inspection routines are described in further detail as follows.

When the first of about 30 wafers 4 from, the same lot are placed on the wafer moving platform 5, wafer inspection starts. The controller 6 controls the platform 5 so that the chip 16 at the address "1" on the wafer 4 shown in FIG. 5 faces the probes 3. The probes 3 contact all the chips 16 in the order indicated by a broken-lined arrow in FIG. 3 to conduct the normal inspection with respect to about 30 inspection criteria. The number of the chips 16 which have been determined to be defective during the normal inspection of the first wafer 4 are counted by the counter 14 during each inspection routine.

When entire inspection on the first wafer 4 is complete, the CPU 9 determines which inspection or test criteria are likely to yield a considerably low probability of defect occurrence. The CPU 9 makes this determination based on a statistical analysis of the number of defective chips counted by the counter 14. The CPU 9 then omits those particular test criteria and thereby arrives at particular number of inspection criteria used during the simplified inspection routine.

Next, the second wafer 4 is set on the platform 5. The CPU 9 inspects this wafer 4 according to the inspection routine illustrated in the flowchart in FIG. 1.

Figure 1:
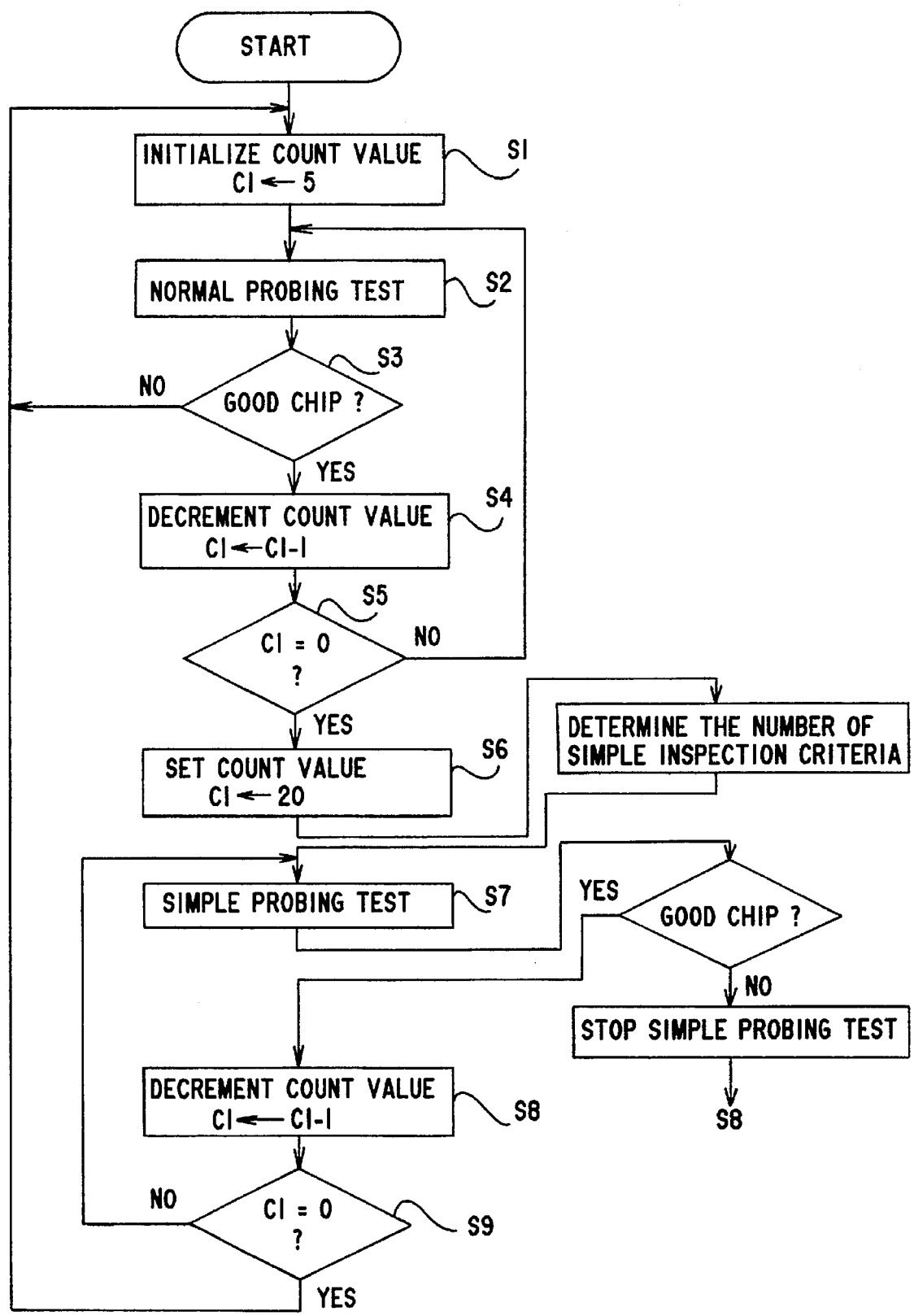

As shown in FIG. 1, the CPU 9 sets the count value, C1, of the counter 15 to "5" in step 1 (indicated as "S1" in the flowchart).

The routine proceeds to step 2 where the CPU executes the normal probing test. The probes 3 contact the chip 16 at a measuring start address "1" following which the chip 16 is inspected based on the approximately 30 inspection criteria. Test data, produced based on each of the inspection criteria, is then stored in the work memory 10 of the microcomputer 7. The CPU 9 next compares the measured value stored in the work memory 10 with a preset specification value to determine whether the measured values of the individual test data correspond to the preset specification values. This comparison and determination routine continues until a time when either a measured test data value fails to correspond to its associated specification value, or until the chip testing routine has been fully performed according to all of the inspection criteria. Should any of the inspection criteria go unmet during the chip's testing, the CPU determines the chip is defective, and resets the decisional flag in the work memory 10 to "0". On the other hand, when all of the test data values correspond to their associated preset specification values, the CPU 9 sets the decisional flag to "1".

In step 3, the CPU 9 determines whether or not the chip 16 at the address "1" is defective or not from the results of the normal probing test in step 2. If the decisional flag has been reset to "0", the CPU 9 determines the chip 16 at the address "1" is defective and returns to step 1. If the decisional flag is set to "1", the CPU 9 determines the chip 16 at address "1" is good and proceeds to step 4.

In step 4, the CPU 9 decrements the count value C1 of the counter 15 (i.e., subtracts "1" from "5") to set the count value C1 to "4". In step 5, the CPU 9 determines if the count value C1 is "0". Since at this point the count value C1 is "4", the CPU 9 returns to step 2 to once again execute the normal probing test.

The CPU 9, having returned to step 2, instructs the driver 13 via the I/O interface 12 to drive the platform 5 to set the chip 16 at the address "2" in order to align with the probes 3. Should the chip 16 at the previous address or address "1" be determined as defective, the count value C1 is set to "5" in step 1 and the normal probing test is performed on the chip 16 at the address "2". Should the chip 16 at the previous address (address "1" in this case) be determined to be properly functioning, the count value C1 decreased by 1, here set to "4" in step 4 and the normal probing test is performed on the chip 16 at the address "2".

When the normal probing test on the chip 16 at the address "2" is completed in the same manner as that on the chip 16 at the address "1", the CPU 9 determines in step 3 whether or not the chip 16 at the address "2" is good. The CPU 9 returns to step 1 when the chip 16 is determined to defective. When the chip 16 is determined to be good, the CPU 9 proceeds to step 4 to decrement "1" from the current count value C1.

In step 5, the CPU 9 determines if the count value C1 is "0". If the count value C1 at this point is other than "0", the CPU 9 returns to step 2. For the chips 16 at addresses "3" and following, the routines in steps 1–5 as described above are repeatedly executed until the CPU 9 determines that the count value C1 is "0" in step 5.

FIGS. 4A and 4B illustrate the reduction in the count values C1 produced in step 5 as the normal probing test is conducted on the individual chips 16. In the first inspection example shown in FIG. 4A, the count value C1 in step 5 becomes "0" only when five successive chips 16 are determined as properly functioning (i.e., as passing the inspection). In the second inspection example shown in FIG. 4B, when an individual chips 16 contains a defect, the normal probing test continues until 5 successive chips 16 are determined to have passed causing the count value C1 in step 5 to be set to "0".

When the count value C1 reaches "0" as shown in FIGS. 4A and 4B, the simple probing test is performed on the chips 16 at the next and successive twenty addresses. For instance, the simple probing test is performed on the chips 16 at the address "6" to the address "25" in the example shown in FIG. 4A, and on the chips 16 at the address "12" to the address "31" in the example shown in FIG. 4B.

As shown in FIG. 1, when the count value C1 of the counter 15 becomes "0" in step 5, the count value C1 is then set to "20" in step 6. In the second inspection example, the chip 16 at the address "12" is aligned to contact the probes 3. The simple probing test is next executed on this chip 16 at address 12 in step 7. In the simple probing test, the wafer inspecting apparatus detects chip defects using simple inspection criteria selected by a statistical analysis of the number of defects found on wafer 4 during the normal probing test. Since the number of simple inspection criteria is determined by eliminating those criteria determined likely to result in a very low probability of defect detection, the total number of simple inspection criteria is considerably fewer (normally about 10 to 15 items in this embodiment) than those for the normal probing test. This significantly shortens the time required for the test per chip 16.

In the simple probing test, the CPU 9 compares the value of individual test data with that of its associated specification value in accordance with each inspection criteria to determine whether the test data corresponds to the specification value. Should there be an instance where the value of any test data fails to correspond with the specification value, the simple probing test is stopped and the CPU 9 proceeds to step 8. When all the values of the test data correspond to their associated preset specification values, the CPU 9 proceeds to step 8. At step 8, the CPU 9 decrements the count value C1 by "1" (subtracts "1" from the count value C1 "20").

In step 9, the CPU 9 determines if the count value C1 is "0". When the count value C1 is not yet "0", the CPU 9 returns to step 7. For the chips 16 at the address "12" and the following addresses, the same sequential process as the sequence of the aforementioned steps 7 to 9 is executed. In this manner, the simple probing test is conducted on twenty chips 16 until the count value C1 is determined to be "0" in step 9. When the count value C1 is "0", the CPU 9 returns to step 1 to execute the normal probing test again starting from the chip 16 at the next address.

The normal probing test is repeatedly performed until five chips 16 are determined as adequate (i.e., having passed) in succession. When five sequentially tested chips 16 have passed, the simple probing test is performed on the next twenty chips 16. In this manner, the normal probing test and the simple probing test are alternately executed until the inspection of all the chips 16 formed on the wafer 4 is completed.

According to this embodiment, the inspection enters the simple probing test only when five successive chips 16 pass the normal probing test. When five successive chips 16 pass the test, this indicates a low probability that defects will occur in that area of the wafer. Based on this implication, the current invention reduces the number of the inspection criteria used by the simple probing test. Particularly, even when the area on the wafer 4 where defects are concentrated is not specified, it is possible to predict through the normal probing test whether or not the area currently undergoing inspection is the area with a low defect-occurrence probability. Accordingly, the simple probing test is always performed on the areas with the low defect-occurrence probability. Even with fewer inspection criteria, therefore, the apparatus and method of the current invention will not overlook defects in the simple probing test.

Due to the fact that the individual wafers 4 in the same lot are produced through the same process, those areas of the wafer 4 having a high defect-occurrence probability exhibit a particular and noticeable correlation among themselves. In this embodiment, based on the data obtained through the full inspection of the chips 16 on the first wafer 4, the CPU 9 selects the simplified inspection criteria specific to this lot. This ensures an intensive defect examination. Consequently, if defects are found during the simple probing test, one could reasonably predict a substantial correspondence to exist between the defect causing items and the lot-specific defects.

This predictability provides the ability to improve the reliability of defect density determinations even during simple probing operations. According to this embodiment, should there exist unspecified areas on the wafer 4 containing defect concentrations, it is still possible to perform highly accurate defect detection and thereby to maintain desirable yield economics of the semiconductor packages at the time of factory shipment. Moreover, this embodiment significantly shortens the inspection time for wafer inspection.

Second Embodiment

A second embodiment of the present invention will now be discussed with reference to the accompanying drawings. This embodiment differs from the first embodiment in the operations of the CPU 9 when the simple probing test is executed. The description of those portions of the second embodiment which are identical to those of the first embodiment will be omitted and only the differences will be discussed below.

Figure 7:
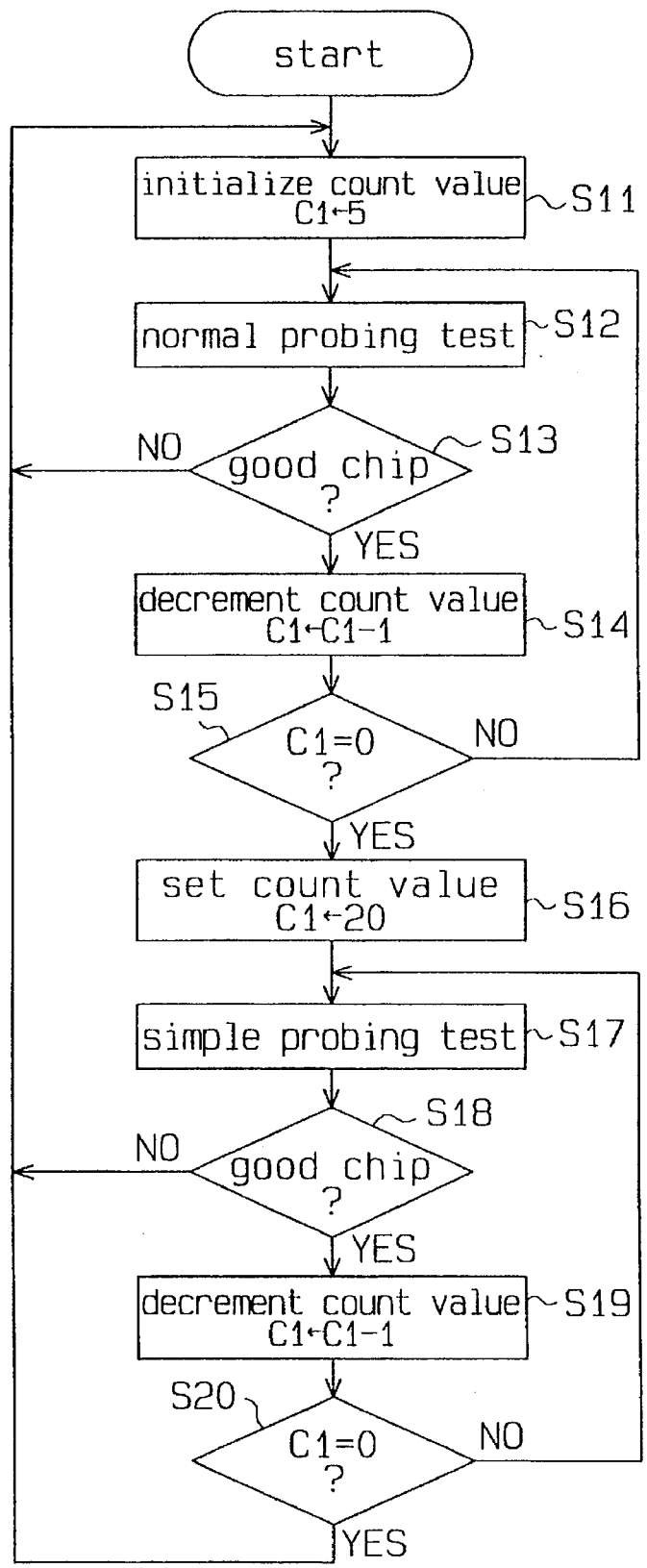
FIG. 7 is a flowchart illustrating the operation of a wafer inspection apparatus according to a second embodiment of this invention.

In the flowchart in FIG. 7, steps 11 to 15 are the same as steps 1 to 5 shown in FIG. 1. Suppose that in the normal probing test executed in steps 11 to 15, when the chip 16 at the address "n" is inspected, five successive chips 16 are determined to have passed the inspection. The count value C1 is then set to "0" in step 15 and the CPU 9 proceeds to step 16. In step 16, the count value C1 of the counter 15 is set to "20".

Next, the simple probing test is performed on the chip 16 at the address "n+1" in step 17. When any defect is found in this simple probing test, the decisional flag is reset to "0", the CPU 9 terminates the simple probing test, and returns to step 11. If no defects are found in the simple probing test, on the other hand, defect determination is performed with respect to each of the inspection criteria. The CPU 9 next sets the decisional flag to "1".

In step 18, the CPU 9 determines whether the decisional flag is "1" after the simple probing test is completed. With the decision flag set to "1" (the chip 16 was proper), the CPU 9 moves to step 19 where "1" is subtracted from the current count value C1, "20".

Figure 6:
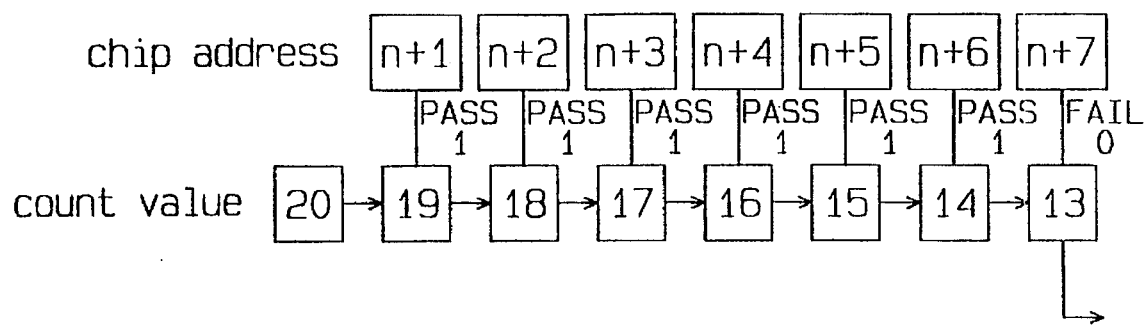

The CPU next, at step 20, determines whether the count value C1 is "0". Should the count value C1 be "19" as in this case, the flow returns to step 17. The simple probing test illustrated in steps 17 to 20 is performed on the chips at the address "n+2" and subsequent addresses as shown in FIG. 6 in the same manner. The simple probing test continues as long as none of the chips 16 are determined to defective at step 18. For example, when the chip 16 at the address "n+7" is determined to be defective as shown in FIG. 6, the decisional flag is reset to "0" in step 17. The setting of this flag is then detected as "0" in step 18, where it serves as an indication that the CPU 9 should return to step 11. In this case, the inspection routine concludes the simple probing test and initializes the normal probing test to inspect the chips 16 at the next address "n+8".

According to this embodiment, when any defect is found during execution of the simple probing test, the simple probing test is terminated and the normal probing test is executed thereafter starting with the chips 16 at the next address. Since the inspection according to the present invention is performed using all of the inspection criteria starting from the chip 16 at the next address to the address of the chip which has been determined as a defect, defects concentrated on the area around the location of the detected defective chip can accurately be detected. Therefore, the second embodiment can further improve the probability of detecting defects as compared with the first embodiment, which executes the simple probing test even after a defect is found. Further, it is possible to maintain high yield economics respecting the semiconductor of packages at the time of their factory shipment.

Although only two embodiments of the present invention have been described herein, it should be apparent to those skilled in the art that the present invention may be embodied in many other specific forms without departing from the spirit or scope of the invention. Particularly, it should be understood that this invention may be embodied in the following manners.

The inspection criteria for the simple probing test may be determined by the following methods. In the first method, among all the inspection criteria, those criteria likely to result in a very low probability of defect occurrence are changed to less complex inspection criteria. The second method changes all the inspection criteria to other less complex inspection criteria. The third method reduces some of the entire inspection criteria and changes those some inspection criteria to less complex inspection criteria.

The addresses of defects found when the full inspection is performed on the first wafer 4 in the same lot of wafers may be memorized so that the normal probing test is performed on the chips 16 at the same addresses as the memorized ones in the inspection of the second and subsequent wafers 4. Further, the normal probing test may be conducted not only on the chip at any memorized address but also on the chips around that particular chip. Furthermore, the area of a high defect-occurrence probability may be predicted from the memorized addresses, so that the normal probing test is performed on the chips belonging to the predicted area.

The number of the wafers 4 initially inspected using the full range of inspection criteria may be variable when determining which inspection criteria to use for the simple probing test. Instead of executing a full inspection on the first wafer 4 in the same lot of wafers used to determine the simplified inspection items, the simplified inspection items may be previously determined based on the results of the full inspections conducted previously.

The inspection order for the chips 16 is not limited to the one indicated by the broken-lined arrow in FIG. 3, but may be changed as needed. For instance, the chips at the peripheral portion may be inspected first, followed by the inspection of the chips at the center.

The conditions indicative of when simple probing should begin following the normal probing test may be changed. For example, the number of chips determined to be good in succession need not be limited to "5" before changing from normal to simplified modes. The actual number may be changed to "10". Furthermore, the number of chips on which the simple probing test should be performed need not be limited to "20".

Therefore, the present examples and embodiments are to be considered as illustrative and not restrictive and the invention is not to be limited to the details given herein, but may be modified within the scope of the appended claims.

What is claimed is:

1. A method for inspecting a plurality of semiconductor devices sequentially formed on a semiconductor substrate, the method comprising the steps of:

setting a predetermined value indicative of the number of said plurality of semiconductor devices to be inspected;

performing a full diagnostic analysis on a first group of semiconductor devices based on a full set of inspection criteria in order to determine whether the semiconductor devices in said first group are properly functional or defective;

counting the number of devices consecutively diagnosed as properly functional during said full diagnostic analysis, deriving a counted value therefrom by decrementing said predetermined value, and resetting said counted value to said predetermined value whenever a semiconductor device is found to be defective; and performing a simplified diagnostic analysis on a second group of semiconductor devices whenever said counted value reaches zero in order to determine whether the semiconductor devices in said second group are properly functional or defective, said simplified diagnostic analysis being based on a subset of said full set of inspection criteria, said subset being determined based upon results of the full diagnostic analysis on said first group of semiconductor devices.

2. The method according to claim 1, wherein each of the full and simplified diagnostic analyses are executed by a computer controlled semiconductor testing apparatus having a diagnostic probe, each analysis comprising the steps of:

engaging the diagnostic probe to a semiconductor device in order to allow test data, generated during execution of a diagnostic routine according to the diagnostic analysis, to be supplied to the testing apparatus;

deriving a measured value from each of said test data;

determining whether the value measured for each test data corresponds to a value predicted by one of said full set of inspection criteria; and determining the functionality of said semiconductor device based on the correspondence between the test data value and the predicted inspection criteria value.

3. A method for sequentially inspecting semiconductor devices formed on a single lot of semiconductor substrates including a first and a second substrate, the method comprising the steps of:

preparing the first substrate of said single lot of semiconductor substrates;

performing a first full diagnostic analysis on all of the semiconductor devices formed on the first substrate;

determining which criteria used in said first full diagnostic analysis result in a low probability of defect detection;

preparing the second substrate of said single lot of semiconductor substrates;

setting a predetermined value indicative of the number of semiconductor devices to be inspected, said semiconductor devices being formed on the second substrate;

executing a second full diagnostic analysis of a predetermined group of devices formed on the second substrate, said first and second full diagnostic analyses being based on a full set of inspection criteria designed to predict the functionality of a semiconductor device;

counting the number of devices consecutively determined to be functional during said second full diagnostic analysis, deriving a counted value therefrom by decrementing said predetermined value, and resetting said counted value to said predetermined value whenever a semiconductor device is determined to be defective; and executing a simplified diagnostic analysis of another predetermined group of semiconductor devices on the second substrate inspected during said second full diagnostic analysis whenever said counted value reaches zero, said simplified diagnostic analysis being based on a subset of said full set of inspection criteria, said subset being determined by reducing said full set of inspection criteria by criteria determined during the first full diagnostic analysis to result in a low probability of defect detection.

* * * * *